United States Patent
Gabaldon et al.

[11] Patent Number: 5,148,967
[45] Date of Patent: Sep. 22, 1992

[54] APPARATUS AND METHOD FOR DETECTING MISSING INTERCONNECT MATERIAL

[75] Inventors: John B. Gabaldon, San Diego; Daniel D. Evans, Jr., Oceanside; Dale W. Cawelti, Carlsbad, all of Calif.

[73] Assignee: Hughes Aircraft Company, Los Angeles, Calif.

[21] Appl. No.: 729,963

[22] Filed: Jul. 15, 1991

[51] Int. Cl.$^5$ .......................... H01L 21/603
[52] U.S. Cl. .................... 228/179; 228/103
[58] Field of Search .......... 228/102, 103, 4.5, 9, 228/179

[56] References Cited
U.S. PATENT DOCUMENTS

| | | | |
|---|---|---|---|
| 4,109,846 | 8/1978 | Pennings et al. | 228/4.5 |
| 4,718,591 | 1/1988 | Hill | 228/4.5 |
| 5,046,655 | 9/1991 | Ohashi et al. | 228/102 |
| 5,060,841 | 10/1991 | Oshima et al. | 228/4.5 |

FOREIGN PATENT DOCUMENTS 59-130433  7/1984  Japan ................... 228/4.5

Primary Examiner—Samuel M. Heinrich
Attorney, Agent, or Firm—Terje Gudmestad; Jeannette M. Walder; Wanda K. Denson-Low

[57] ABSTRACT

Apparatus and method for detecting missing interconnect material. The distance traveled by a bonding tool is measured while the interconnect material is being bonded to a site. Unless it exceeds a predetermined threshold, a signal is generated indicating missing interconnect material. A pivoting system associated mating electrical contacts, and a measurement/comparator are advantageously employed to facilitate this measurement.

5 Claims, 3 Drawing Sheets

APPARATUS AND METHOD FOR DETECTING MISSING INTERCONNECT MATERIAL

BACKGROUND OF THE INVENTION

1. Field of The Invention

This invention relates to bonders which are employed to make electrical connection between electrodes or pads on semi-conductor devices and lead-out pads. More specifically, the present invention relates to apparatus and processes for detecting whether the interconnect material used during the bonding processing is missing.

2. Description of Related Art

Machines which make electrical connections between electrodes or pads on semi-conductor devices and lead-out pads are well-known. Two such machines are illustrated in U.S. Pat. Nos. 4,817,848 and 4,718,591.

Sometimes during the use of these machines, the interconnect material is not present at the interconnect site when it should be. Unless its absence is quickly detected, tool damage can result, together with damage to successive interconnect sites. The need to promptly detect the absence of interconnect material from the bonding site, therefore, has existed, as illustrated by the missing wire detector disclosed in U.S. Pat. No. 4,558,596.

The techniques used in the past to detect missing interconnect material, such as ultrasonics impedance measurement, has suffered from certain problems. These problems include great sensitivity to set up parameters, to bonding tool types, and to spurious loading errors introduced by material irregularities at the target surface or in the interconnect material. Other problems are also present.

SUMMARY OF THE INVENTION

A primary object of the present invention is to obviate these and other problems in the prior art.

A further object of the present invention is to use techniques to detect missing interconnecting material which are independent of ultrasonic and bonding tool characteristics.

A still further object of the present invention is to provide apparatus and methods for quickly detecting missing interconnect material so as to minimize damage to the bonding tool, thereby providing a longer mean time between tool changes.

A still further object of the present invention is to provide apparatus and methods for quickly detecting missing interconnect material so as to insure that only one interconnect site is damaged as a consequence thereof.

These, as well as still further objects of the present invention, are achieved by providing apparatus and methods which measure the distance traveled by a bonding tool while the interconnect material is being bonded to a site. A missing material signal is generated when the measurement falls below a threshold amount.

In one embodiment, a touchdown mechanism is used to urge the bonding tool against the site. The touchdown mechanism is compliantly mounted to a moving carriage. A set of electrical contacts are mounted such that one contact is affixed to the touchdown mechanism, while the other contact is affixed to the carriage. Force means are then employed to urge the touchdown mechanism toward the site. Distance measurements are then made by analyzing the state of the electrical contacts (i.e., opened or closed) with respect to the position of the carriage and the status of the actual bonding process.

These, as well as still further features and benefits of the present invention, will become apparent from an examination of the accompanying drawings and the following description of the preferred embodiments.

BRIEF DESCRIPTION OF THE DRAWINGS

FIG. 1 illustrates the carriage of the bonding machine at an elevated position.

FIG. 2 illustrates the carriage having been lowered to the point where the bonding tool just comes in contact with the site.

FIG. 3 illustrates the carriage having been further lowered due to over-travel.

FIG. 4 illustrates the carriage in the same position as it was in FIG. 3, except that it is after actual bonding has taken place.

FIG. 5 illustrates the carriage after it has been moved up until the point where the electrical contacts between the carriage and touchdown mechanism again come in contact.

DESCRIPTION OF THE PREFERRED EMBODIMENTS

FIG. illustrates one embodiment of the present invention.

Figure 1:
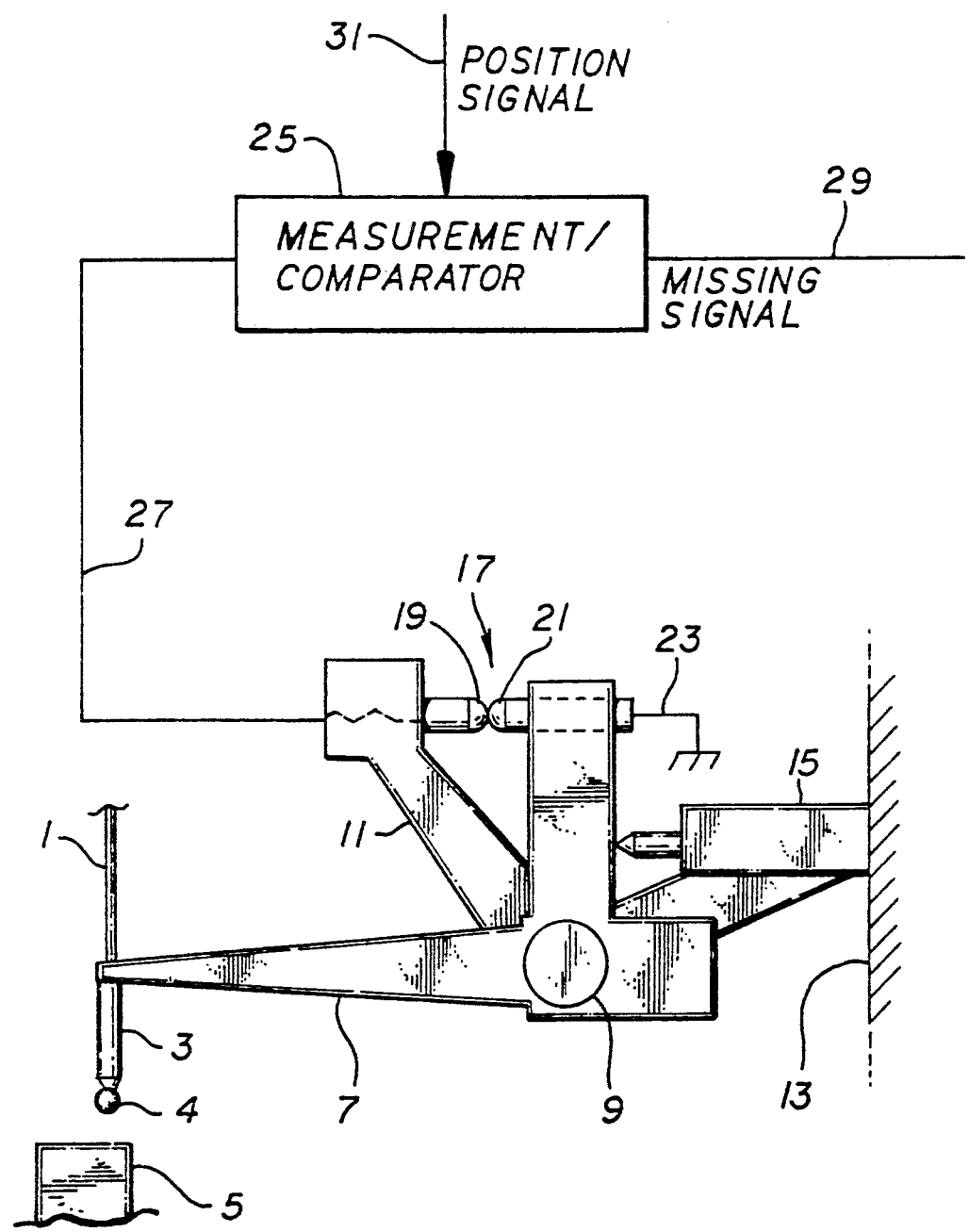
FIGS. 1-5 illustrate one preferred embodiment of the present invention at different stages of the bonding process.

As shown in FIG. 1, interconnect material 1 is loaded in a bonding tool 3 ending in a ball (or column) of interconnect material 4. The bonding tool 3 is oriented so as to bring the ball of material 4 in contact with a target site 5.

The interconnect tool 3 is affixed to a touchdown mechanism 7 which is compliantly mounted through a pivot joint 9 to a carriage 11. In turn, the carriage 11 is affixed to a frame 13. Vertical movement of the carriage 11 and frame 13 is controlled by means not shown.

A force actuator 15 is positioned so as to apply controllable force to the touchdown mechanism 7 so as to urge the bonding tool 3 in the direction of the target site 5.

A pair of mating electrical contacts 17 include a contact 19 mounted to the carriage 11 and a moving contact 21 mounted to the touchdown mechanism 7. The moving contact 21 is electrically connected to ground through a ground wire 23. The fixed contact 23 is electrically connected to a measurement/comparator 25 through a connection wire 27. The measurement/comparator 25 has a missing signal output 29.

In FIG. the carriage is shown in a raised position. While in this position, the mating contacts 17 are electrically joined.

Figure 2:
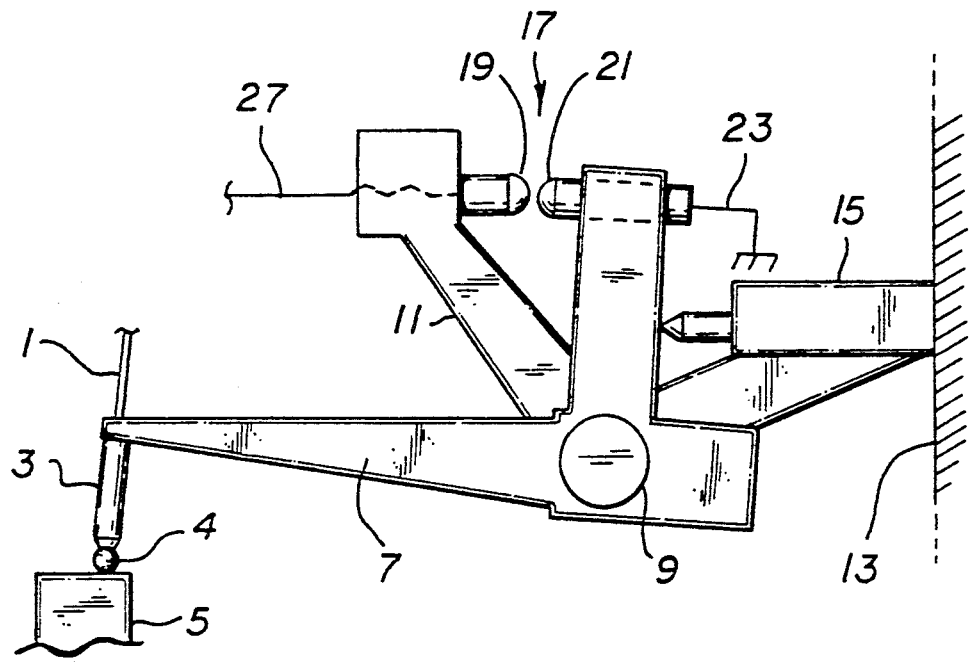

FIG. 2 shows the apparatus of FIG. 1 after the fixed carriage 11 has moved down so as to cause the interconnect ball 4 to come in contact with the target site 5 and, immediately following that contact, so as to cause the mating contacts 17 to separate and thus break the electrical contact which they were making. At this point, the carriage 11 continues to move downward for a programmed distance. The additional distance which the carriage 11 travels after separation of the mating contacts 17 and before the carriage 11 comes to a halt is called over-travel.

Figure 3:
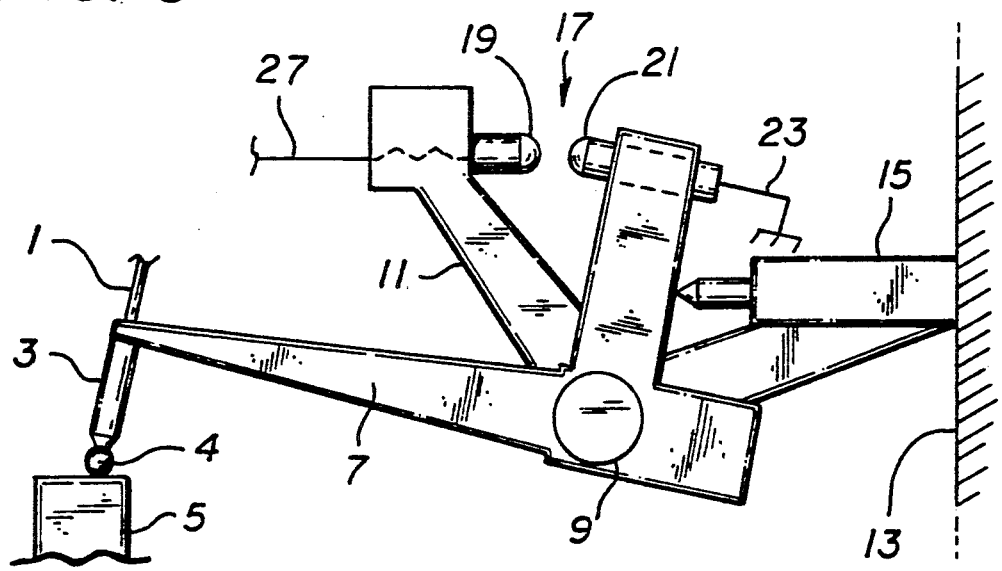

FIG. 3 illustrates the apparatus of FIG. 1 after the downward moving force has been removed from the carriage 11 and after the carriage 11 has come to a halt, i.e., after the carriage 11 has traveled through its over travel. As can be seen in FIG. 3, the gap between the mating contacts 17 has increased due to the over-travel. A programmed amount of bonding energy is then applied to the bonding tool 3, typically using force and ultrasonics.

Figure 4:
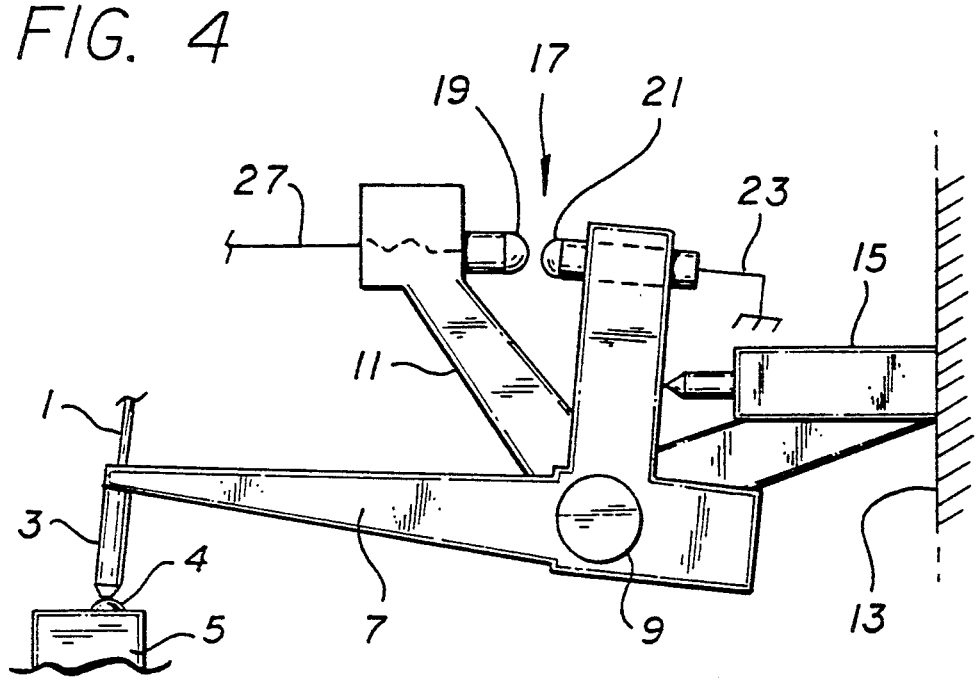

During bonding, the interconnect ball 4 deforms. In turn, this causes the bonding tool 3 to move further toward the target site 5 and, in turn, the moving contact 21 to move closer to the fixed contact 19 as shown in FIG. 4.

Figure 5:
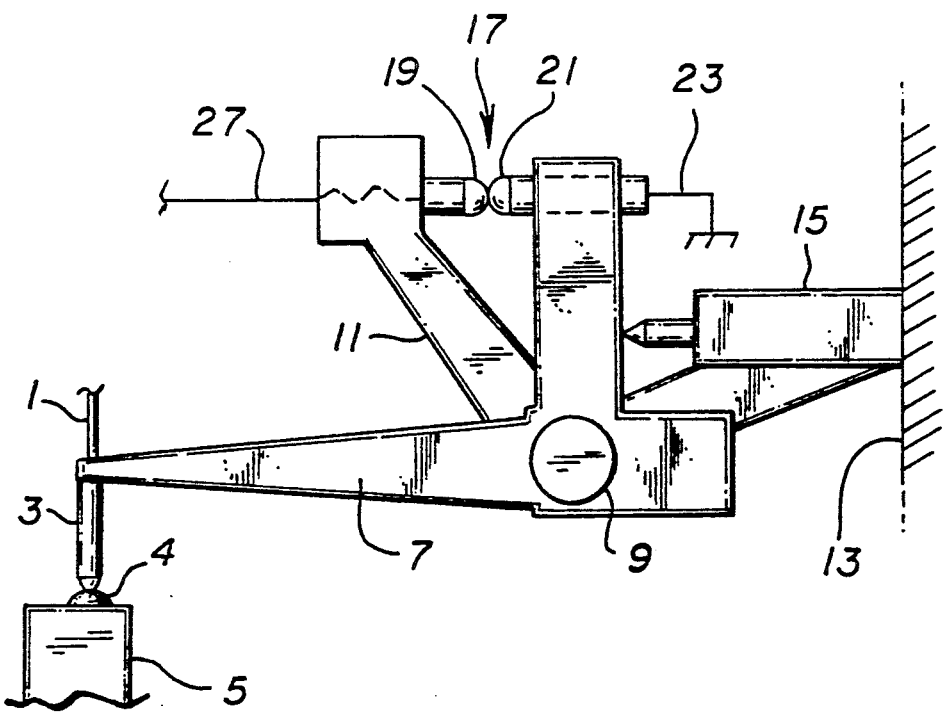

After the bonding is complete, the bonding energy is removed from the bonding tool 3. Upward force is then applied to the carriage 11 to move it upwardly. Shortly after this upward movement begins, moving contact 21 will again come into electrical contact with fixed contact 19, as shown in FIG. 5.

The distance the bonding tool 3 travels during the bonding process (hereafter "bonding distance") serves as a direct indication of the presence of interconnect material. When interconnect material is absent, it is approximately zero. Otherwise, is has a significant value.

In practice, the "bonding distance" will usually be greater than zero, even if interconnect material is missing. This is due to the bonding tool boring slightly into the interconnect site, as well as other factors. Thus, a "missing material" indicator should be generated wherever the "bonding distance" is less than a predetermined threshold amount.

As should be apparent to those skilled in the art, numerous techniques can be used to measure the "bonding distance." One advantageous technique is to measure the upward distance the carriage 11 moves immediately following completion of bonding (i.e. from the position shown in FIG. 4) until the contacts 17 again close (i.e. to the position shown in FIG. 5) (hereinafter "recovery distance") The "bonding distance" is then equal to the "over-travel" distance minus the "recovery distance."

Two electrical signals can advantageously be used to make these measurements. The first is the electrical signal from the contacts 17. The second is a position signal 31 from the servo controller which controls the position of the carriage 11 (not shown). The position signal 31 is typically in the form of a stream of pulses whose frequency is directly proportional to the velocity of the carriage 11.

During "over-travel" of the carriage 11, a measurement/comparator 25 counts the pulses in the position signal 31. This count is then decremented while the carriage 11 moves through the "recovery distance." The resulting count is directly proportional to the "bonding distance." If it does not exceed a threshold amount (which accounts for bonding tool boring in the interconnect site and other factors when interconnect material is missing), a comparator in measurement/comparator 25 causes a missing signal 29 to be generated. The missing signal 29 can then be used to stop subsequent bonding until new interconnect material is loaded.

It is of course to be understood that the present invention is applicable to a wide variety of embodiments, configurations, and processes. For example, although well applicable to wire bonding machines, the present invention is just as applicable to machines using ribbon, TAB, or other types of interconnect materials. Application of the present invention to die attach, tab bonding, as well as other types of bonding processes is also contemplated.

In a similar vain, the location of the mating contacts 17 can obviously vary, as well as the technique used to measure and analyze the "bonding distance " Numerous other embodiments and variations should, as well, now be apparent to those skilled in the art. In short, the present invention is intended to be limited solely to the following claims and their lawful equivalences.

What is claimed is:

1. A method for detecting missing interconnect material during repetitive bonding, including the steps of:
    (a) measuring the distance traveled by a bonding tool while the apparatus is attempting to bond interconnect material to a site;
    (b) comparing the distance measured by said measurement means with a predetermined amount; and
    (c) generating a missing signal to indicate the absence of interconnect material when said measurement falls below the predetermined amount.

2. The method of claim 7 wherein said bonding tool comprises a touchdown mechanism for urging the bonding tool against the site; a carriage to which said touchdown mechanism is compliantly mounted; a fixed electrical contact affixed to said carriage; and a moveable electrical contact affixed to said touchdown mechanism and oriented to electrically contact with said fixed electrical contact when said touchdown mechanism rotates to a certain position with respect to said carriage; and
    wherein step (b) further comprises the substep of subtracting the gap between the fixed and movable electrical contacts before bonding from the size of the gap after bonding.

3. The method of claim 1 wherein step (a) comprises the steps of:
    (1) measuring the recovery distance, the distance travelled by the bonding tool immediately following completion of a bonding;
    (2) determining the over travel distance, the additional distance travelled by the bonding tool after it has moved downward and contacted a target site; and
    (3) subtracting the recovery distance from the over travel distance to determine the bonding distance, the distance travelled by the bonding tool while the apparatus is attempting to bond interconnect material to a site.

4. The method of claim 3 wherein step (a)(2) includes the substep of generating a pulsed signal indicative of the over travel distance; and
    wherein step (a)(3) includes the substep of decrementing the pulsed signal during movement of the carriage through the recovery distance.

5. The method of claim 1 wherein said predetermined amount includes an amount to compensate for boring the bonding tool into the interconnect site when interconnect material is missing.

* * * * *